United States Patent
Triyoso et al.

(10) Patent No.: US 9,530,833 B2
(45) Date of Patent: Dec. 27, 2016

(54) SEMICONDUCTOR STRUCTURE INCLUDING CAPACITORS HAVING DIFFERENT CAPACITOR DIELECTRICS AND METHOD FOR THE FORMATION THEREOF

(71) Applicant: GLOBALFOUNDRIES Inc., Grand Cayman (KY)

(72) Inventors: Dina H. Triyoso, Dresden (DE); Sanford Chu, Singapore (SG); Johannes Mueller, Dresden (DE); Patrick Polakowski, Dresden (DE)

(73) Assignee: GLOBALFOUNDARIES Inc., Grand Cayman (KY)

( * ) Notice: Subject to any disclaimer, the term of this patent is extended or adjusted under 35 U.S.C. 154(b) by 247 days.

(21) Appl. No.: 14/307,078

(22) Filed: Jun. 17, 2014

(65) Prior Publication Data

US 2015/0364535 A1    Dec. 17, 2015

(51) Int. Cl.
| | |
|---|---|
| *H01L 29/92* | (2006.01) |
| *H01L 27/108* | (2006.01) |
| *H01L 49/02* | (2006.01) |
| *H01L 27/115* | (2006.01) |
| *H01L 27/08* | (2006.01) |

(52) U.S. Cl.
CPC ........... *H01L 28/55* (2013.01); *H01L 27/0805* (2013.01); *H01L 27/11502* (2013.01); *H01L 28/40* (2013.01); *H01L 27/1085* (2013.01)

(58) Field of Classification Search
CPC ...... H01L 28/40; H01L 28/55; H01L 27/0805; H01L 27/1085; H01L 27/10805; H01L 27/11502–27/11504

See application file for complete search history.

(56) References Cited

U.S. PATENT DOCUMENTS

| | | | | |
|---|---|---|---|---|
| 6,972,449 B2 * | 12/2005 | Yoshikawa | ....... | H01L 27/11502 257/295 |
| 7,598,556 B2 * | 10/2009 | Mikawa | ............ | H01L 27/11507 257/295 |

(Continued)

OTHER PUBLICATIONS

Park et al., "Effect of forming gas annealing on the ferroelectric properties of Hf0.5Zr0.5O2 thin films with and without Pt electrodes," Appl. Phys. Lett., 102:112914, 2013.

*Primary Examiner* — Michael Trinh
(74) *Attorney, Agent, or Firm* — Amerson Law Firm, PLLC

(57) ABSTRACT

An illustrative method disclosed herein includes providing a semiconductor structure. The semiconductor structure includes a first interlayer dielectric provided over a semiconductor substrate. A first electrode of a first capacitor is formed over the first interlayer dielectric. A layer of first dielectric material is deposited over the first electrode of the first capacitor and the first interlayer dielectric. A layer of electrically conductive material is deposited over the layer of first dielectric material. A second electrode of the first capacitor and a first electrode of the second capacitor are formed from the layer of electrically conductive material. After the formation of the second electrode of the first capacitor and the first electrode of the second capacitor, a layer of second dielectric material is deposited and a second electrode of the second capacitor is formed over the layer of second dielectric material.

20 Claims, 10 Drawing Sheets

(56) References Cited

U.S. PATENT DOCUMENTS

| | | | |
|---|---|---|---|
| 2002/0098645 A1* | 7/2002 | Jung | H01L 27/11507 |
| | | | 438/253 |
| 2004/0173874 A1* | 9/2004 | Saigoh | G11C 11/22 |
| | | | 257/535 |
| 2009/0174984 A1* | 7/2009 | Tachibana | H01L 27/11504 |
| | | | 361/306.1 |
| 2014/0339541 A1* | 11/2014 | Kato | H01L 27/11563 |
| | | | 257/43 |

* cited by examiner

SEMICONDUCTOR STRUCTURE INCLUDING CAPACITORS HAVING DIFFERENT CAPACITOR DIELECTRICS AND METHOD FOR THE FORMATION THEREOF

BACKGROUND OF THE INVENTION

1. Field of the Invention

Generally, the present disclosure relates to the field of integrated circuits, and, in particular, to integrated circuits including capacitors having different capacitor dielectrics.

2. Description of the Related Art

Integrated circuits typically include a large number of circuit elements, which form an electric circuit. In addition to active devices such as, for example, field effect transistors and/or bipolar transistors, integrated circuits may include passive devices such as resistors, inductances and/or capacitors.

Types of capacitors that may be provided in integrated circuits include metal-insulator-metal capacitors. Metal-insulator-metal capacitors may be provided in additional interconnect levels, which are provided in addition to interconnect levels wherein electrically conductive lines connecting circuit elements of integrated circuits are provided.

Metal-insulator-metal capacitors may be used as decoupling capacitors in CMOS logic integrated circuits to minimize voltage drops at the power grids. In such decoupling capacitors, thin films of a high-k dielectric material may be employed as a capacitor dielectric to obtain a high capacitance density of the decoupling capacitors and a low leakage current. Other applications of metal-insulator-metal capacitors include filter and analog capacitors, for example, in analog-to-digital converters or digital-to-analog converters, radio frequency coupling capacitors and radio frequency bypass capacitors in radio frequency oscillators, resonator circuits and matching networks.

In many applications of integrated circuits, such as integrated circuits for computers, consumer electronics, communication electronics and automotive electronics, nonvolatile embedded memory is desired. Types of nonvolatile memory include floating gate-based flash memory. However, integrating floating gate-based flash memory cells into integrated circuits that also include circuitry of another type, such as, for example, logic circuitry, may have issues associated therewith, in particular due to the relatively high process complexity of the formation of floating gate-based flash memory cells. Typically, more than eight additional photo masks may be required when floating gate-based flash memory cells are provided in an integrated circuit, in addition to photo masks that are used for forming other devices of the integrated circuit. Furthermore, in the operation of floating gate-based flash memory cells, relatively high voltages may be required, which may lead to further issues due to the need for high voltage transistors in the integrated circuit.

As an alternative to floating gate-based flash memory, other types of nonvolatile memory have been proposed, which include spin-transfer torque magnetoresistive random access memory (STT-MRAM), phase-change memory (PCM) and resistive random access memory (RRAM). However, using these techniques in embedded applications may be associated with issues related to technology maturity, cost and compatibility with processes for the manufacturing of logic circuits.

Embodiments of the present disclosure provide semiconductor structures and methods for the formation thereof which may provide an improved integration of nonvolatile memory into integrated circuits.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure. The semiconductor structure includes a first interlayer dielectric provided over a semiconductor substrate. A first electrode of a first capacitor is formed over the first interlayer dielectric. A layer of first dielectric material is deposited over the first electrode of the first capacitor and the first interlayer dielectric. A layer of electrically conductive material is deposited over the layer of first dielectric material. A second electrode of the first capacitor and a first electrode of the second capacitor are formed from the layer of electrically conductive material. After the formation of the second electrode of the first capacitor and the first electrode of the second capacitor, a layer of second dielectric material is deposited and a second electrode of the second capacitor is formed over the layer of second dielectric material.

An illustrative semiconductor structure disclosed herein includes an interlayer dielectric provided over a semiconductor substrate, a first capacitor and a second capacitor. Each of the first capacitor and the second capacitor includes a first electrode and a second electrode and is arranged over the interlayer dielectric. The semiconductor structure further includes a layer of substantially non-ferroelectric dielectric material and a layer of ferroelectric dielectric material. The layer of substantially non-ferroelectric dielectric material includes a first portion and a second portion. The first portion is arranged between the first electrode and the second electrode of the first capacitor and provides a capacitor dielectric of the first capacitor. The second portion is arranged between the interlayer dielectric and the first electrode of the second capacitor. The layer of ferroelectric dielectric material includes a first portion arranged between the first electrode and the second electrode of the second capacitor and provides a capacitor dielectric of the second capacitor.

Another illustrative method disclosed herein includes providing a semiconductor structure comprising a first interlayer dielectric provided over a semiconductor substrate. A first electrode of a capacitor is formed over the interlayer dielectric. A layer of a ferroelectric dielectric material is formed over the first electrode. A second electrode of the capacitor is formed over the ferroelectric dielectric material.

BRIEF DESCRIPTION OF THE DRAWINGS

The disclosure may be understood by reference to the following description taken in conjunction with the accompanying drawings, in which like reference numerals identify like elements, and in which.

Figure 1:
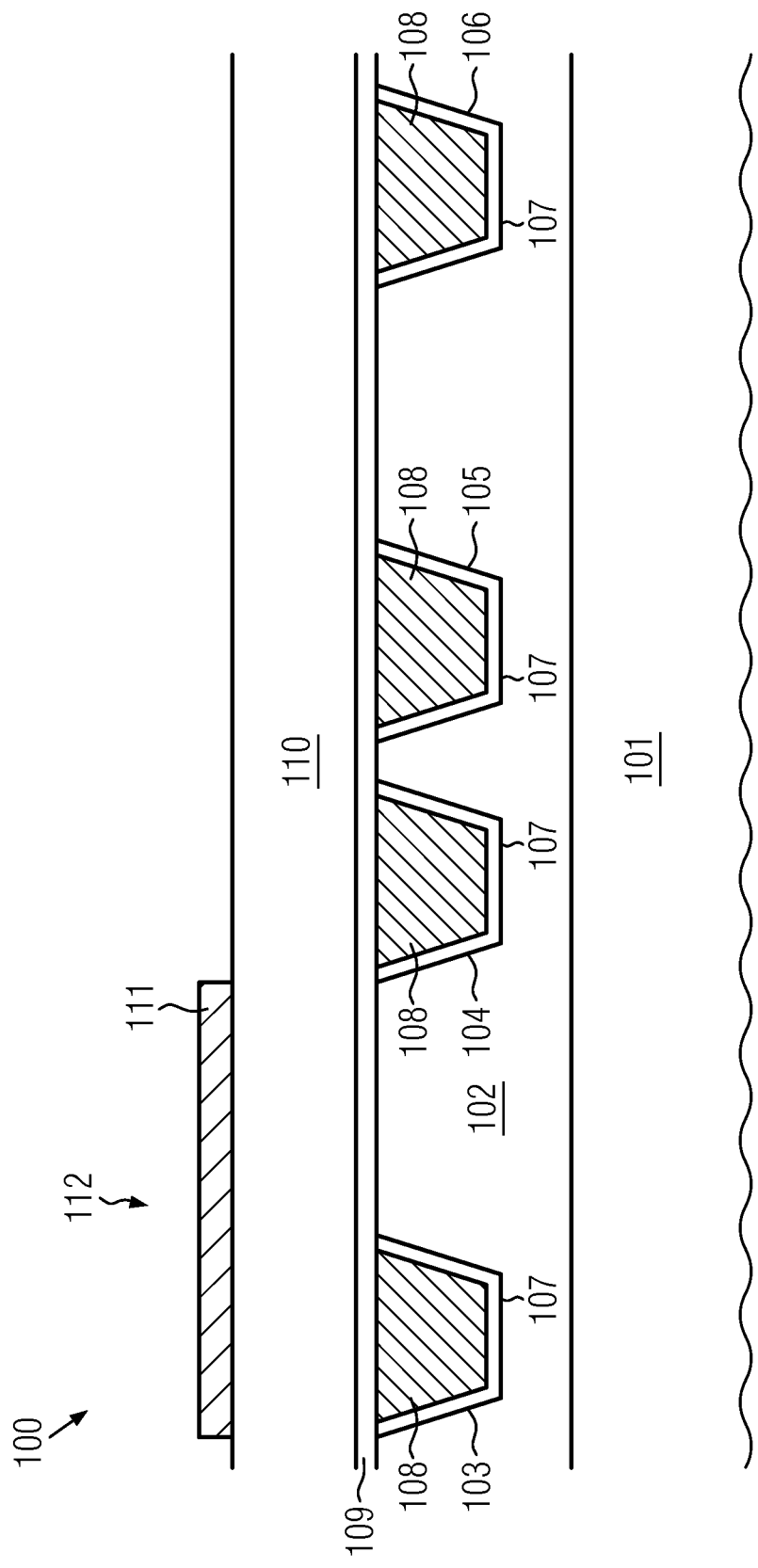
FIGS. 1-5 show schematic cross-sectional views of a semiconductor structure according to an embodiment in stages of a manufacturing process according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure provides a process integration scheme that allows a fabrication of both decoupling metal-insulator-metal capacitors and ferroelectric metal-insulator-metal capacitors in a standard CMOS logic process. Each of the ferroelectric metal-insulator-metal capacitors may be employed for forming a nonvolatile memory cell, wherein each of the nonvolatile memory cells includes one transistor and one ferroelectric metal-insulator-metal capacitor.

In some embodiments, the ferroelectric metal-insulator-metal capacitor may be a three-dimensional capacitor, which may help to reduce the size of the nonvolatile memory cells. This may be helpful for high density embedded ferroelectric random access memory (FRAM) applications. For forming a three-dimensional ferroelectric metal-insulator-metal capacitor, an extra masking and etching may be performed to define a narrow capacitor trench prior to the formation of a metal-insulator-metal stack.

FIG. 1 shows a schematic cross-sectional view of a semiconductor structure 100 in a stage of a manufacturing process. The semiconductor structure 100 includes a substrate 101. The substrate 101 may include a bulk semiconductor substrate, for example, a wafer or die of a semiconductor material, such as silicon. In other embodiments, the substrate 101 may include a semiconductor-on-insulator substrate that includes a layer of a semiconductor material, such as silicon, provided on a layer of an electrically insulating material, such as silicon dioxide. The layer of electrically insulating material may be provided on a support substrate, which may be a silicon wafer or a silicon die.

The substrate 101 may further include circuit elements of an integrated circuit. In particular, the substrate 101 may include a plurality of field effect transistors and/or other circuit elements, such as resistors and/or diodes.

The semiconductor structure 100 further includes an interlayer dielectric 102 that is provided over the substrate 101. The interlayer dielectric 102 may include an electrically insulating material, such as silicon dioxide or a low-k dielectric material. In the interlayer dielectric 102, trenches 103, 104, 105, 106 may be provided. The trenches 103, 104, 105, 106 may be filled with an electrically conductive material 108, for example, copper or a copper alloy. A diffusion barrier layer 107 may be provided in each of the trenches 103, 104, 105, 106 between the electrically conductive material 108 and the interlayer dielectric 102 for substantially avoiding or at least reducing a diffusion of the electrically conductive material 108 into the interlayer dielectric 102 and/or other components of the semiconductor structure 100.

The trenches 103, 104, 105, 106 filled with the electrically conductive material 108 provide electrically conductive lines which may be used for electrically connecting circuit elements, such as transistors formed at the substrate 101, with other circuit elements of the semiconductor structure 100, in particular with capacitors formed above the interlayer dielectric 102, as will be described in more detail below. For connecting the electrically conductive lines provided by the trenches 103, 104, 105, 106 filled with the electrically conductive material 108 with circuit elements formed at the substrate 101, contact vias filled with an electrically conductive material (not shown) may be provided.

In some embodiments, the semiconductor structure 100 may include further interlayer dielectric layers including trenches and contact vias filled with an electrically conductive material, which are provided between the interlayer dielectric 102 and circuit elements formed at the substrate 101.

The above-described features may be formed using known techniques for the formation of semiconductor structures. In particular, circuit elements at the substrate 101 may be formed by means of known semiconductor processing techniques. The interlayer dielectric 102 may be formed using a deposition process, such as chemical vapor deposition (CVD), plasma enhanced chemical vapor deposition (PECVD) and/or spin coating. The trenches 103, 104, 105,

106 may be formed by means of techniques of photolithography and etching. After the formation of the trenches 103, 104, 105, 106, the diffusion barrier layer 107 may be deposited using deposition processes, such as CVD, PECVD and/or atomic layer deposition (ALD). Then, the electrically conductive material 108 may be deposited using techniques of electroplating, and portions of the diffusion barrier layer 107 and the electrically conductive material 108 outside the trenches 103, 104, 105, 106 may be removed by means of chemical mechanical polishing (CMP).

After these processing steps, a capping layer 109 may be deposited over the electrically conductive material 108 in the trenches 103, 104, 105, 106 and the interlayer dielectric 102. The capping layer 109 may include silicon nitride, and it may be formed by means of a process for the deposition of silicon nitride that may be performed at a relatively low temperature, such as, for example, PECVD. In some embodiments, the deposition process for forming the capping layer 109 may be performed at a temperature of about 450° C. or less.

Thereafter, an interlayer dielectric 110 may be deposited on the capping layer 109. In some embodiments, the interlayer dielectric 110 may include silicon dioxide, and it may be formed by means of a CVD process or PECVD process wherein tetraethyl orthosilicate (TEOS) is employed as a reactant.

After the formation of the interlayer dielectric 102, a bottom electrode 111 of a first capacitor 112 may be formed over the interlayer dielectric 110. The bottom electrode 111 may include an electrically conductive material, such as titanium nitride, tantalum nitride, tantalum and/or ruthenium. In other embodiments, the bottom electrode 111 may include another electrically conductive material, for example an electrically conductive material having a relatively high work function, such as iridium, iridium dioxide or ruthenium dioxide. The bottom electrode 111 of the first capacitor 112 may be provided above the trench 103 and above an area between the trenches 103, 104, but not above the trench 104. Thus, above the trench 104, there is a portion of the interlayer dielectric 110 that is not covered by the bottom electrode 111 of the first capacitor 112. Furthermore, there are portions of the interlayer dielectric 110 above the trenches 105, 106 and above an area between the trenches 105, 106 that are not covered by the bottom electrode 111 of the first transistor 112.

The bottom electrode 111 of the first capacitor 112 may be formed by depositing a layer of the electrically conductive material from which the bottom electrode 111 is formed over the interlayer dielectric 110 and patterning the layer of the electrically conductive material by means of processes of photolithography and etching.

Figure 2:
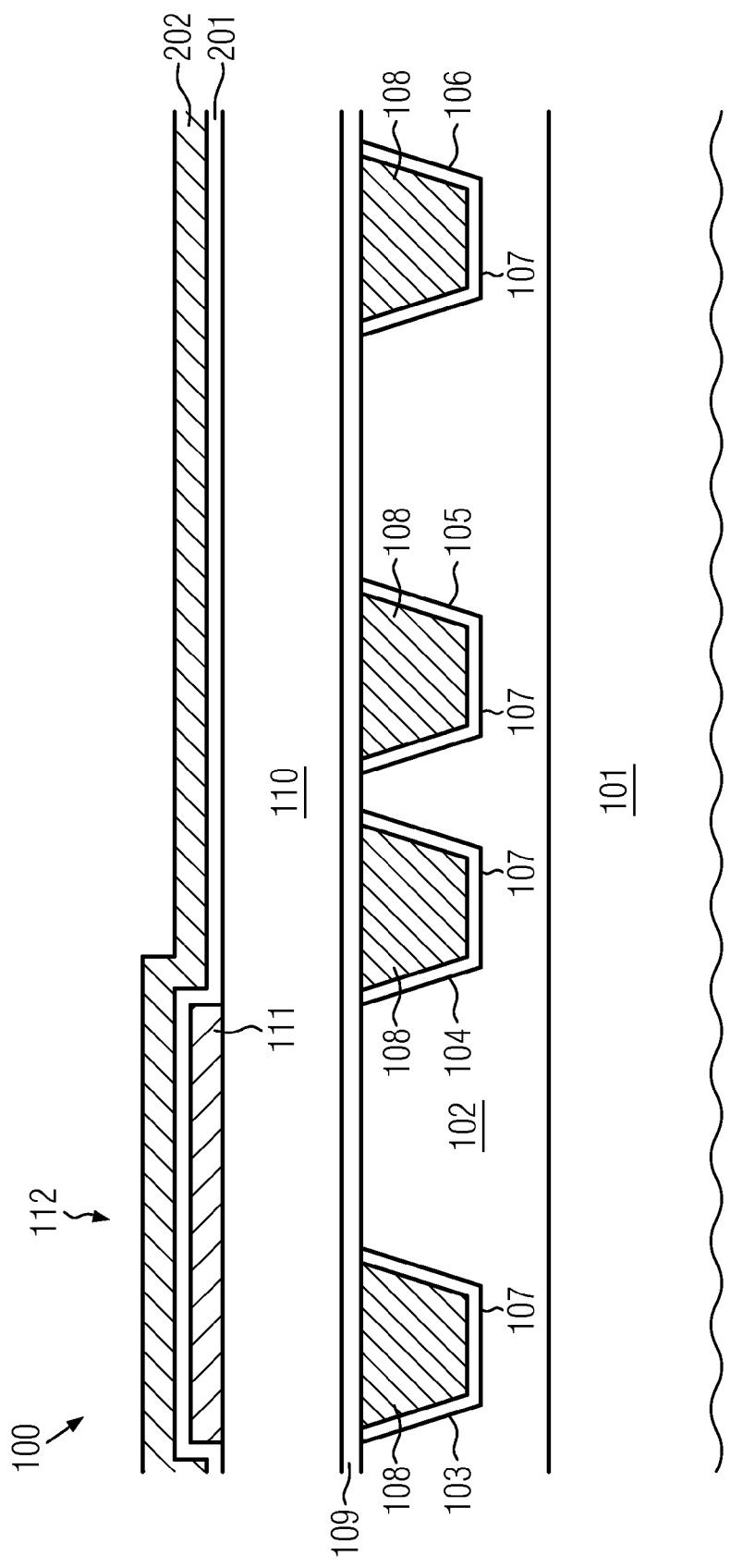

FIG. 2 shows a schematic cross-sectional view of the semiconductor structure 100 in a later stage of the manufacturing process. After the formation of the bottom electrode 111, a layer of a dielectric material 201 may be deposited over the bottom electrode 111 of the first capacitor 112 and the portion of the interlayer dielectric 110 that is not covered by the bottom electrode 111.

In some embodiments, the layer 201 of first dielectric material may be a substantially homogeneous layer of a high-k dielectric material. The high-k dielectric material may have a dielectric constant that is greater than a dielectric constant of silicon dioxide. In particular, the high-k dielectric material may have a dielectric constant greater than four.

In other embodiments, the layer 201 of first dielectric material may include a plurality of sub-layers, wherein at least two of the plurality of sub-layers are formed of different materials. In such embodiments, the layer 201 of first dielectric material may include a first sub-layer that is provided directly on the bottom electrode 111 of the first capacitor 112 and the portions of the interlayer dielectric 110 that are not covered by the bottom electrode 111, a second sub-layer provided on the first sub-layer and a third sub-layer provided on the second sub-layer.

Figure 11:
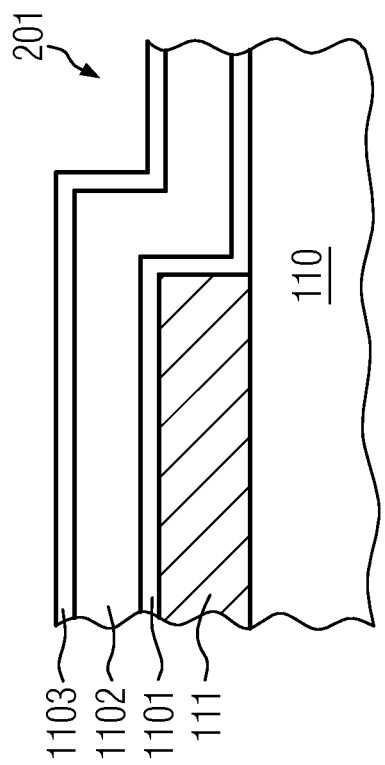
FIG. 11 shows an enlarged view of a portion of a schematic cross-sectional view of a semiconductor structure according to an embodiment in a stage of a manufacturing process according to an embodiment.

An enlarged schematic cross-sectional view of a portion of the semiconductor structure 100 after the formation of the layer 201 of first dielectric material in an embodiment wherein the layer 201 of first dielectric material includes three sub-layers is shown in FIG. 11. Therein, the first sub-layer of the layer 201 of first dielectric material is denoted by reference numeral 1101, the second sub-layer is denoted by reference numeral 1102 and the third sub-layer is denoted by reference numeral 1103.

The first sub-layer 1101 and the third sub-layer 1103 may be formed of substantially the same material, for example, hafnium dioxide and/or zirconium dioxide. The second sub-layer 1102 may be formed of a material that is different from the material of the first sub-layer 1101 and the third sub-layer 1103, for example, aluminum oxide.

In embodiments wherein the layer 201 of first dielectric material is a substantially homogeneous layer of a high-k material, the layer 201 of first dielectric material may include tantalum pentoxide ($Ta_2O_5$).

For forming the layer 201 of first dielectric material, or, in embodiments wherein the layer 201 includes a plurality of sub-layers, processes of deposition, such as CVD, PECVD and/or ALD, may be employed.

The one or more materials that are used for forming the layer 201 of first dielectric material and the techniques employed for forming the layer 201 of first dielectric material may be adapted such that the layer 201 of first dielectric material is substantially non-ferroelectric.

Further features of the layer 201 of first dielectric material may correspond to those of known capacitor dielectrics employed in metal-insulator-metal capacitors that are provided as decoupling capacitors in integrated circuits.

After the formation of the layer 201 of first dielectric material, a layer 202 of electrically conductive material may be deposited over the layer 201 of first dielectric material. In some embodiments, the layer 202 of electrically conductive material may include titanium nitride, tantalum nitride, tantalum and/or ruthenium. In some embodiments, the layer 202 of electrically conductive material and the bottom electrode 111 of the first capacitor 112 may be formed of substantially the same material. For forming the layer 202 of electrically conductive material, deposition techniques such as CVD, PECVD and physical vapor deposition (PVD) may be employed.

Figure 3:
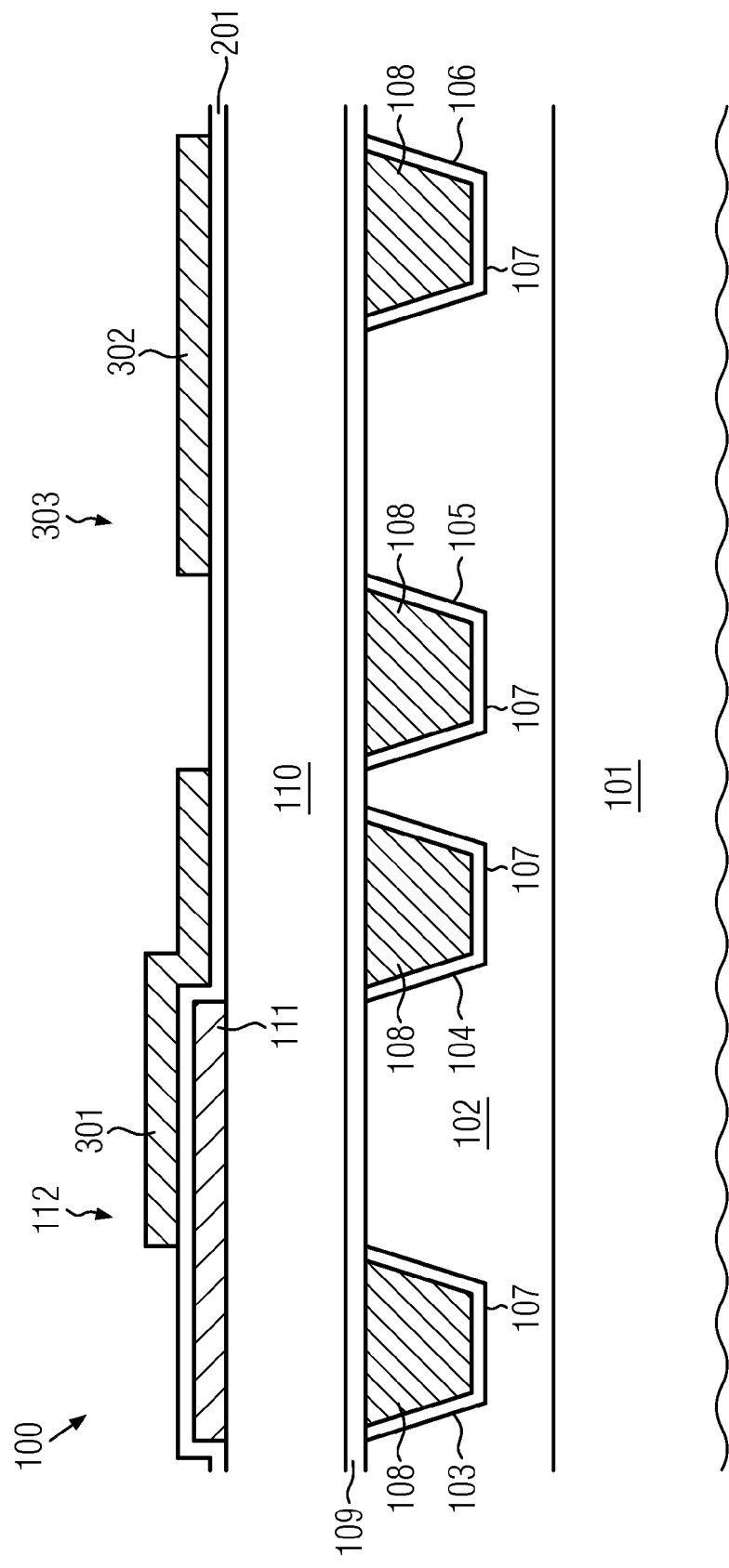

FIG. 3 shows a schematic cross-sectional view of the semiconductor structure 100 in a later stage of the manufacturing process. After the formation of the layer 202 of electrically conductive material, a top electrode 301 of the first capacitor 112 and a bottom electrode 302 of a second capacitor 303 may be formed from the layer 202 of electrically conductive material. This may be done by patterning the layer 202 of electrically conductive material by means of processes of photolithography and etching. Since the top electrode 301 of the first capacitor 112 and the bottom electrode 302 of the second capacitor 303 are both formed from the layer 202 of electrically conductive material, the top electrode 301 of the first capacitor 112 and the bottom electrode 302 of the second capacitor 303 are formed of substantially the same material.

The top electrode 301 of the first capacitor 112 may be provided over the area between the trenches 103, 104 and over the trench 104, but not over the trench 103. Thus, above the area between the trenches 103, 104, there is a portion of the layer 201 of the first dielectric material that is arranged between the bottom electrode 111 and the top electrode 301 of the first capacitor 112 and forms a capacitor dielectric of the first capacitor 112. The portions of the bottom electrode 111 and the top electrode 301 of the first capacitor 112 over the area between the trenches 103, 104 may have a configuration similar to that of a plate capacitor.

The portion of the bottom electrode 111 above the trench 103 may be used for providing an electrical connection between the bottom electrode 111 and the electrically conductive line provided by the trench 103 filled with the electrically conductive material 108, and the portion of the top electrode 301 above the trench 104 may be employed for providing an electrical connection between the top electrode 301 and the electrically conductive line provided by the trench 104 filled with the electrically conductive material 108, as will be detailed below.

The bottom electrode 302 of the second capacitor 303 may be provided above an area between the trenches 105, 106 and above the trench 106 but not above the trench 105.

Figure 4:
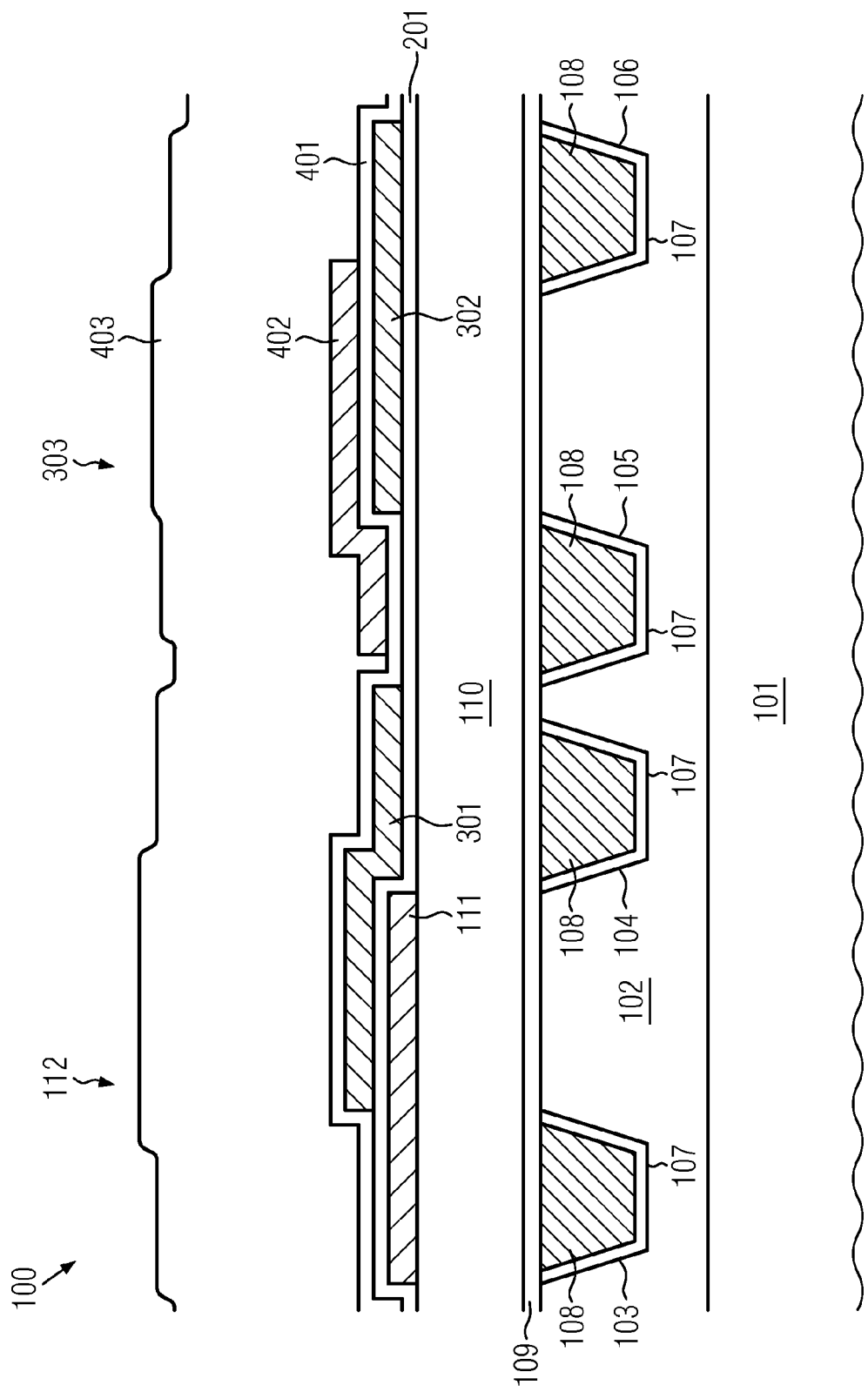

FIG. 4 shows a schematic cross-sectional view of the semiconductor structure 100 in a later stage of the manufacturing process. After the formation of the top electrode 301 of the first capacitor 112 and the bottom electrode 302 of the second capacitor 303, a layer 401 of a second dielectric material may be deposited. The second dielectric material may be a ferroelectric dielectric material. In some embodiments, the second dielectric material may be a material that obtains ferroelectric properties when further processing steps are performed after the deposition of the layer 401 of second dielectric material. Such further processing steps may include, for example, an annealing, as will be detailed below. For simplicity, the term "ferroelectric dielectric material" is sometimes used herein generally for denoting the material of the second dielectric layer 401, even if the layer 401 is formed of a material that obtains ferroelectric properties only after further processing steps and is initially non-ferroelectric directly after its deposition.

In some embodiments, the layer 401 of second dielectric material may include hafnium dioxide, zirconium dioxide and/or hafnium zirconium dioxide.

The second dielectric material of the layer 401 may be doped. For example, in some embodiments, the layer 401 may include silicon-doped hafnium dioxide. Aluminum-doped hafnium dioxide, strontium-doped hafnium dioxide, yttrium-doped hafnium dioxide, gadolinium-doped hafnium dioxide and/or other rare earth-doped hafnium oxide systems may also be employed. In further embodiments, the layer 401 may include substantially undoped hafnium dioxide. In some embodiments, the deposition process used for depositing the second dielectric of the layer 401 may be adapted such that the as-deposited material is substantially amorphous and does not have ferroelectric properties.

In embodiments wherein the layer 401 of second dielectric includes silicon-doped hafnium dioxide, an ALD process may be performed for depositing the layer 401 of second dielectric material. In the ALD process, tetrakis-(ethylmethylamino)-hafnium, tetrakis-dimethylamino-silane and ozone may be employed. In some embodiments, metal organic precursors and/or halide precursors may additionally be used. The ALD process may be performed at a temperature of less than 500° C., for example, at a temperature in a range from about 200-400° C., in particular at a temperature of about 350° C. A silicon content of the layer 401 of second dielectric material may be in a range from about 2-5 mol %, in particular in a range from about 2.5-4.5 mol %. The silicon dioxide content of the layer 401 of second dielectric material may be controlled by varying the composition of gases employed in the ALD process. Depositing the layer 401 of second dielectric material at a relatively low temperature as described above may help to obtain an amorphous structure of the as-deposited layer 401 of second dielectric material.

In embodiments wherein the layer 401 of second dielectric material includes aluminum-doped hafnium dioxide, yttrium-doped hafnium dioxide or gadolinium-doped hafnium dioxide, an ALD process wherein tetrakis-(ethylmethylamino)-hafnium, hafnium tetrachloride as well as ozone and/or water are used may be employed. Furthermore, depending on whether the layer 401 of second dielectric material includes aluminum, yttrium or gadolinium, trimethylaluminum, tris(methylcyclopentadienyl)yttrium or tris (isopropylcyclopentane)gadolinium may be used. Further parameters of the ALD process may correspond to those described above in the context of embodiments wherein the layer 401 of second dielectric material includes silicon-doped hafnium dioxide.

In embodiments wherein the layer 401 of second dielectric material includes substantially undoped hafnium dioxide, a CVD process may be used for forming the layer 401 of second dielectric material, wherein materials and/or parameters corresponding to the embodiments described above are used but the substances provided for doping the layer 401 of second dielectric material are omitted.

In embodiments wherein the layer 401 of second dielectric material includes hafnium zirconium dioxide, an ALD process wherein tetrakis(ethylmethylamino)zirconium, tetrakis(ethylmethylamino)hafnium and ozone are used may be performed for depositing the layer 401 of second dielectric material. In some embodiments, the hafnium zirconium dioxide may have a composition in accordance with the formula $Hf_xZr_{1-x}O_2$, for example, a composition in accordance with the formula $Hf_{0.5}Zr_{0.5}O_2$. Further parameters of the ALD process may correspond to those described above in the context of embodiments wherein the layer 401 of second dielectric material includes silicon-doped hafnium dioxide.

In embodiments wherein the layer 401 of second dielectric material includes zirconium dioxide, deposition processes similar to those described above in the context of embodiments wherein the layer 401 of second dielectric material includes hafnium dioxide may be used, wherein reactants including zirconium are employed instead of reactants including hafnium. In particular, tetrakis(ethylmethylamino)zirconium may be used instead of tetrakis(ethylmethylamino)hafnium, and zirconium tetrachloride may be used instead of hafnium tetrachloride.

After the deposition of the layer 401 of second dielectric material, a top electrode 402 of the second capacitor 303 may be formed. For forming the top electrode 402 of the second capacitor 403, a layer of an electrically conductive material, for example a layer including titanium nitride, tantalum nitride, tantalum and/or ruthenium, may be deposited. For this purpose, deposition techniques such as CVD, PECVD and/or PVD may be employed. Thereafter, techniques of photolithography and etching may be employed for patterning the layer of electrically conductive material, wherein the top electrode 402 of the second capacitor 303 is formed. In some embodiments, the electrically conductive material from which the top electrode 402 is formed may be substantially the same material as the materials of the bottom electrode 111 and the top electrode 301 of the first capacitor 112 and the bottom electrode 302 of the second capacitor 303.

The top electrode 402 of the second capacitor 303 may be provided over the area between the trenches 105, 106 and over the trench 105 but not over the trench 106.

The portions of the bottom electrode 302 and the top electrode 402 above the area between the trenches 105, 106 may have a configuration corresponding to that of a plate capacitor, wherein a portion of the layer 401 of second dielectric material between the bottom electrode 302 and the top electrode 402 of the second capacitor 303 provides a capacitor dielectric.

In some embodiments, after the deposition of the layer of electrically conductive material from which the top electrode 402 of the second capacitor 303 is formed, or after the patterning of this layer of electrically conductive material by means of photolithography and etching, an annealing process may be performed for crystallizing the layer 401 of second dielectric material. Due to the crystallization of the layer 401 of second dielectric material in the presence of the material of the top electrode 402 of the second capacitor 303 thereon, a crystal structure of at least the portion of the layer 401 of second dielectric material between the bottom electrode 302 and the top electrode 402 of the second capacitor 303 having ferroelectric properties may be obtained. The annealing process may be a rapid thermal annealing process wherein the semiconductor structure 100 is exposed to a temperature in a range from about 300-500° C.

After the formation of the top electrode 402 of the second capacitor 303, an interlayer dielectric 403 may be deposited. In some embodiments, the interlayer dielectric 403 may include silicon dioxide, and it may be formed by means of a CVD process or PECVD process wherein tetraethyl orthosilicate (TEOS) is used as a reactant. As schematically illustrated in FIG. 4, after the deposition of the interlayer dielectric 403, the interlayer dielectric 403 may have a relatively uneven surface, since the shape of the surface of the interlayer dielectric 403 may be influenced by the topology of the first capacitor 112 and the second capacitor 303 below the interlayer dielectric 403.

Figure 5:
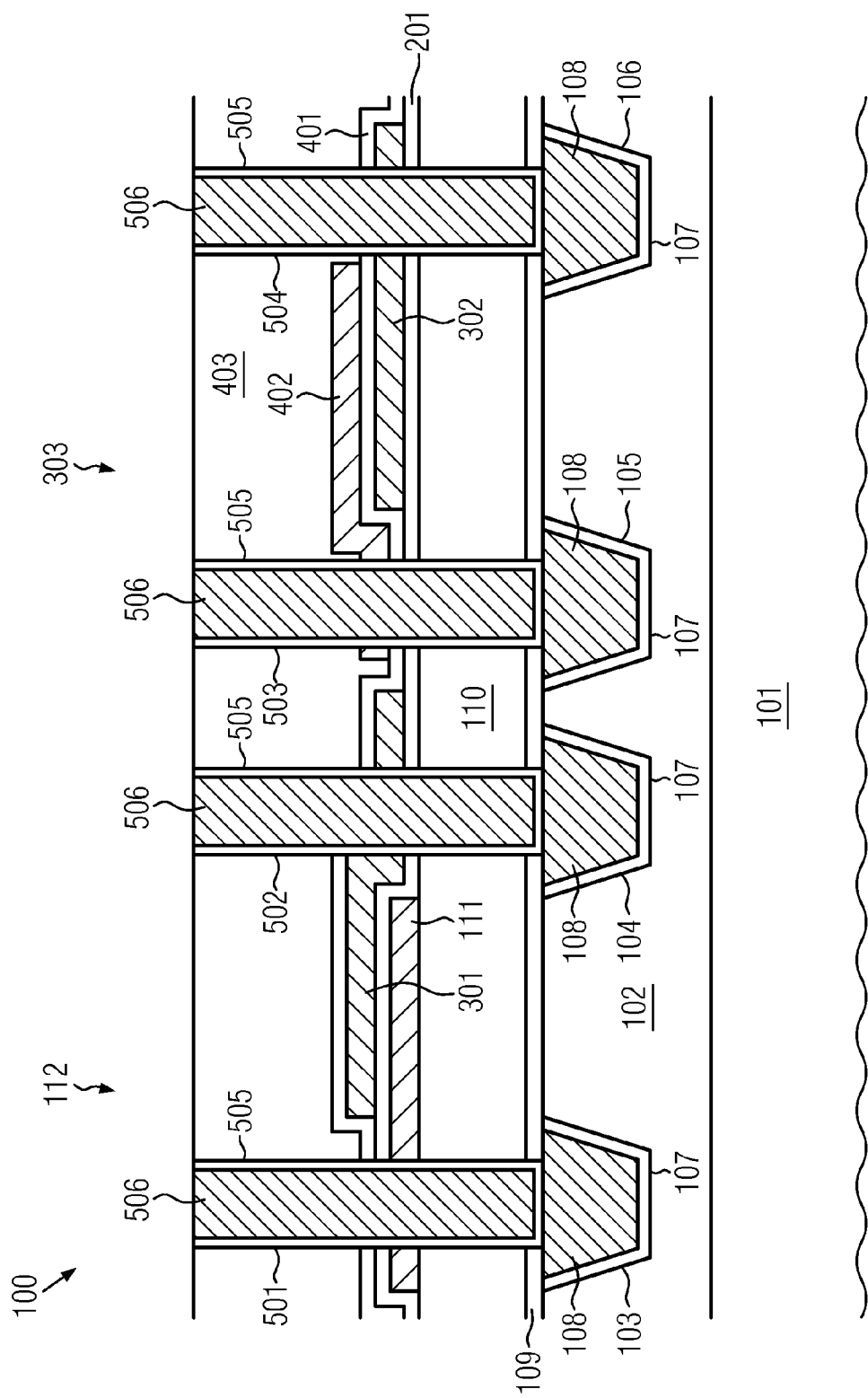

FIG. 5 shows a schematic cross-sectional view of the semiconductor structure 100 in a later stage of the manufacturing process. After the deposition of the interlayer dielectric 403, a planarization process may be performed for obtaining a substantially planar surface of the interlayer dielectric 403. The planarization process may be a CMP process.

Thereafter, contact vias 501, 502, 503, 504 may be formed. The contact via 501 is provided over the trench 103, the contact via 502 is provided over the trench 104, the contact via 503 is provided over the trench 105, and the contact via 504 is provided over the trench 106. Each of the contact vias 501, 502, 503, 504 extends through the capping layer 109, the interlayer dielectric 110, the layer 201 of first dielectric material, the layer 401 of second dielectric material and the interlayer dielectric 403. Furthermore, each of the contact vias 501, 502, 503, 504 extends through one of the electrodes 111, 301, 302, 402 of the capacitors 112, 303. In particular, the contact via 501 extends through the bottom electrode 111 of the first capacitor 112 and the contact via 502 extends through the top electrode 301 of the first capacitor 112. The contact via 503 extends through the top electrode 402 of the second capacitor 303 and the contact via 504 extends through the bottom electrode 302 of the second capacitor 303.

After the formation of the contact vias 501, 502, 503, 504, a diffusion barrier layer 505 may be deposited. Then, the contact vias 501, 502, 503, 504 may be filled with an electrically conductive material 506. The electrically conductive material 506 may include a metal, for example, copper or a copper alloy.

Thereafter, a CMP process may be performed for removing portions of the diffusion barrier layer 505 and the electrically conductive material 506 outside the contact vias 501, 502, 503, 504.

The contact via 501 filled with the electrically conductive material 506 provides an electrical connection between the bottom electrode 111 of the first capacitor 112 and the trench 103 filled with the electrically conductive material 108. The contact via 502 filled with the electrically conductive material 506 provides an electrical connection between the top electrode 301 of the first capacitor 112 and the trench 104 filled with the electrically conductive material 108. The contact via 503 filled with the electrically conductive material 506 provides an electrical connection between the top electrode 402 of the second capacitor 303 and the trench 105 filled with the electrically conductive material 108. The contact via 504 filled with the electrically conductive material 506 provides an electrical connection between the bottom electrode 302 of the second capacitor 303 and the trench 106 filled with the electrically conductive material 108. Thus, the electrically conductive lines provided by the trenches 103, 104, 105, 106 filled with the electrically conductive material 108 may be employed for electrically connecting the first capacitor 112 and the second capacitor 303 to other portions of the semiconductor structure 100.

In particular, the first capacitor 112 may be used as a decoupling capacitor connected between electrically conductive lines in a power grid of an integrated circuit formed in the semiconductor structure 100, similar to decoupling capacitors in known integrated circuits. The second capacitor 303 that includes a ferroelectric capacitor dielectric provided by the portion of the layer 401 of second dielectric material may be used for storing a bit of data in a nonvolatile memory cell, as will be described in more detail below.

The present disclosure is not limited to embodiments wherein the bottom electrode 302 and the top electrode 402 of the second capacitor 303 are substantially planar, as described above with reference to FIGS. 1-5. In other embodiments, the second capacitor 303 may be a three-dimensional metal-insulator-metal capacitor. In the following, such embodiments will be described with reference to FIGS. 6-9.

For convenience, in FIGS. 1-5, on the one hand, and FIGS. 6-9, on the other hand, like reference numerals are used to denote like components. Unless explicitly stated otherwise, features of components of the embodiments described with reference to FIGS. 6-9 may correspond to features of components of the embodiments described with reference to FIGS. 1-5 denoted by like reference numerals, and corresponding methods may be used for the formation thereof.

Figure 6:
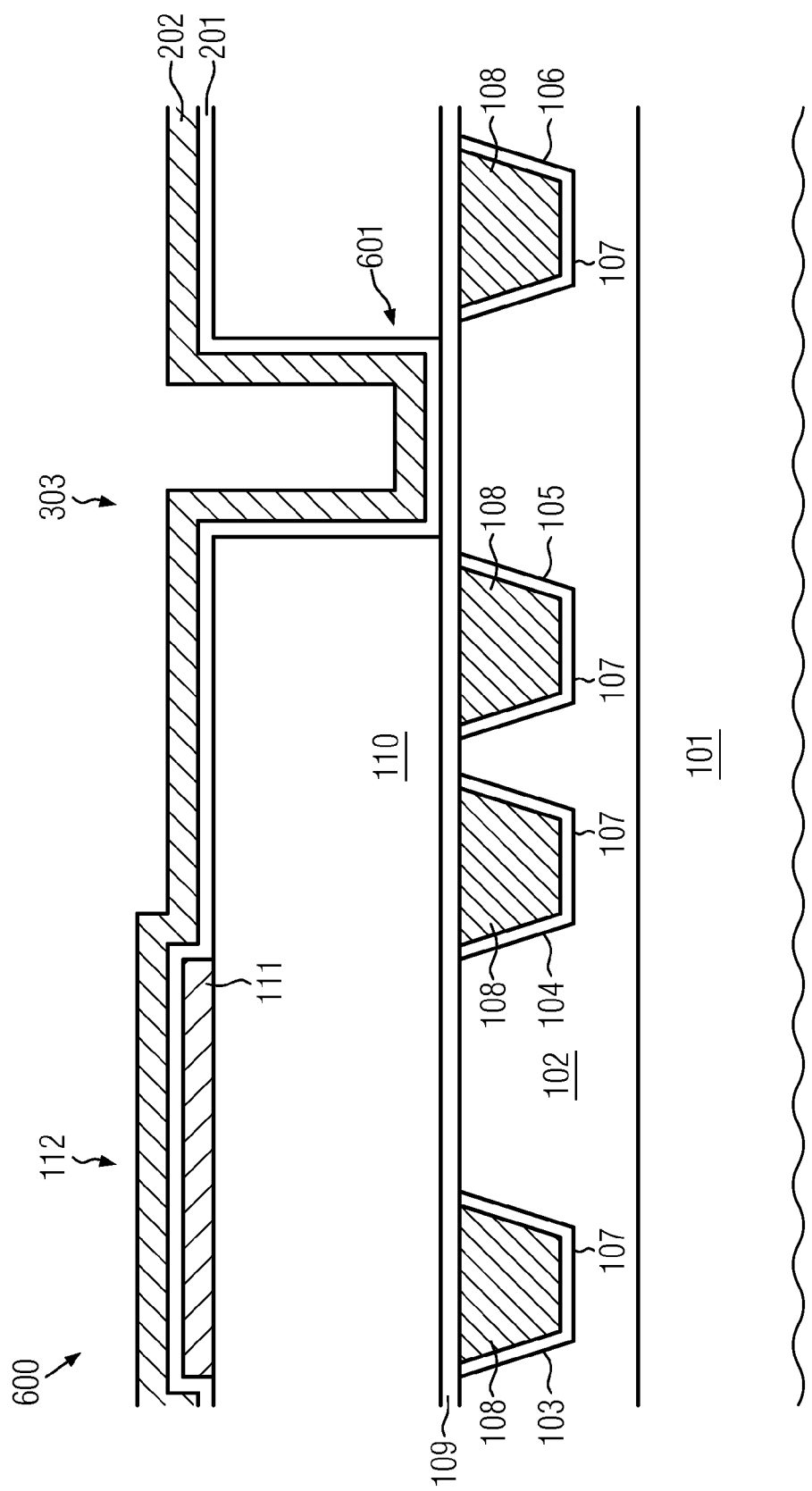
FIGS. 6-9 show schematic cross-sectional views of a semiconductor structure according to an embodiment in stages of a manufacturing process according to an embodiment.

FIG. 6 shows a schematic cross-sectional view of a semiconductor structure 600 according to an embodiment in a stage of a manufacturing process according to an embodiment. Similar to the semiconductor structure 100 described above with reference to FIGS. 1-5, the semiconductor structure 600 includes a substrate 101 and an interlayer dielectric 102. In the interlayer dielectric 102, trenches 103, 104, 105, 106 filled with an electrically conductive material 108 are formed. A diffusion barrier layer 107 may be provided for substantially avoiding or at least reducing a diffusion of the electrically conductive material 108 into other portions of the semiconductor structure 600. On the interlayer dielectric 102 and the trenches 103, 104, 105, 106 filled with the electrically conductive material 108, a cap layer 109 may be provided. On the cap layer 109, an interlayer dielectric 110 may be provided.

In the interlayer dielectric 110, a trench 601 may be formed. This may be done by means of techniques of photolithography and etching. The trench 601 may be arranged above an area between the trenches 105, 106 but not above the trenches 105, 106 themselves. In some embodiments, the trench 601 may extend through the interlayer dielectric 110 to the cap layer 109. In such embodiments, the cap layer 109 may be used as an etch stop layer in the formation of the trench 601. In other embodiments, the trench 601 may extend through the cap layer 109 into the interlayer dielectric 102.

The semiconductor structure 600 may further include a bottom electrode 111 of a first capacitor 112, a layer 201 of first dielectric material and a layer 202 of electrically conductive material. The layer 201 of first dielectric material may be provided over the bottom electrode 111 of the first capacitor 112, and over portions of the interlayer dielectric 110 that are not covered by the bottom electrode 111. In particular, the layer 201 of first dielectric material may be provided on a top surface of the interlayer dielectric 110, on sidewalls of the trench 601, and at a bottom of the trench 601.

The semiconductor structure 600 further includes a layer 202 of electrically conductive material. The layer 202 of electrically conductive material may be provided over the layer 201 of first dielectric material. In particular, the layer 202 of electrically conductive material may be provided above the bottom electrode 111 of the first capacitor 112 as well as at the sidewalls and at the bottom of the trench 601, and above portions of the interlayer dielectric 110 over the trenches 105, 106.

The present disclosure is not limited to embodiments wherein the layer 201 of first dielectric material is provided at the sidewalls and at the bottom of the trench 601. In other embodiments, the layer 202 of electrically conductive material may be provided directly on the interlayer dielectric 110 at the sidewalls of the trench 601 and directly on the capping layer 109 at the bottom of the trench 601. In such embodiments, the trench 601 may be formed after the formation of the layer 201 of first dielectric material. In embodiments wherein the layer 201 of first dielectric material is provided at the sidewalls and at the bottom of the trench 601, the trench 601 may be formed before the deposition of the layer 201 of first dielectric material, for example, before the formation of the bottom electrode 111 of the first capacitor 112 or after the formation of the bottom electrode 111.

Figure 7:
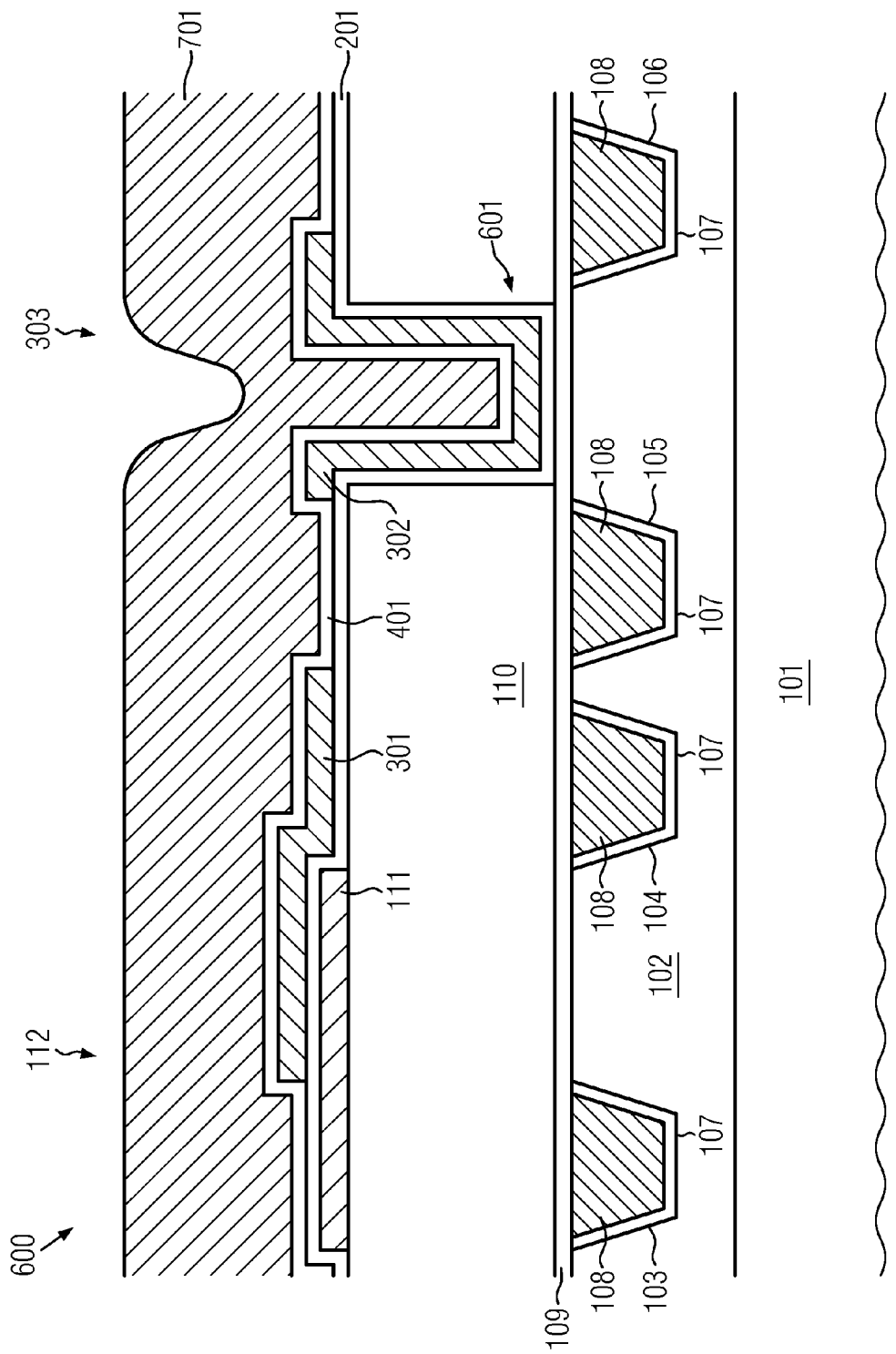

FIG. 7 shows a schematic cross-sectional view of the semiconductor structure 600 in a later stage of the manufacturing process. After the deposition of the layer 202 of electrically conductive material, the layer 202 of electrically conductive material may be patterned by means of processes of photolithography and etching to form a top electrode 301 of the first capacitor 112 and a bottom electrode 302 of a second capacitor 303.

The top electrode 301 of the first capacitor 112 may have a configuration corresponding to that of the top electrode 301 of the first capacitor 112 in the embodiments described above with reference to FIGS. 1-5. The bottom electrode 302 of the second capacitor 303 may be provided at the bottom and at the sidewalls of the trench 601. Additionally, the bottom electrode 302 of the second capacitor 303 may have a portion above the trench 106, whereas no portion of the bottom electrode 302 is provided above the trench 105.

After the formation of the electrodes 301, 302, a layer 401 of second dielectric material may be deposited. The layer 401 may cover the entire bottom electrode 302 of the second capacitor 303, including portions at the sidewall and at the bottom of the trench 601. Additionally, the layer 401 of second dielectric material may cover substantially horizontal portions of the layer 201 of first dielectric material and the bottom electrode 302 of the second capacitor 303 outside the trench 601.

After the formation of the layer 401 of second dielectric material, an electrically conductive material 701 may be deposited over the semiconductor structure 600. The electrically conductive material 701 may include titanium nitride, tantalum nitride, tantalum and/or ruthenium. The electrically conductive material 701 may be deposited by means of deposition techniques such as CVD, PECVD and/or PVD. An amount of the electrically conductive material 701 that is deposited may be adapted such that the entire trench 601 is filled with the electrically conductive material 701. Therefore, a relatively large thickness of the electrically conductive material 701 may be obtained outside the trench 601. Furthermore, a surface of the as-deposited electrically conductive material 701 may be relatively uneven, having a recess over the trench 601, as shown in FIG. 7.

Figure 8:
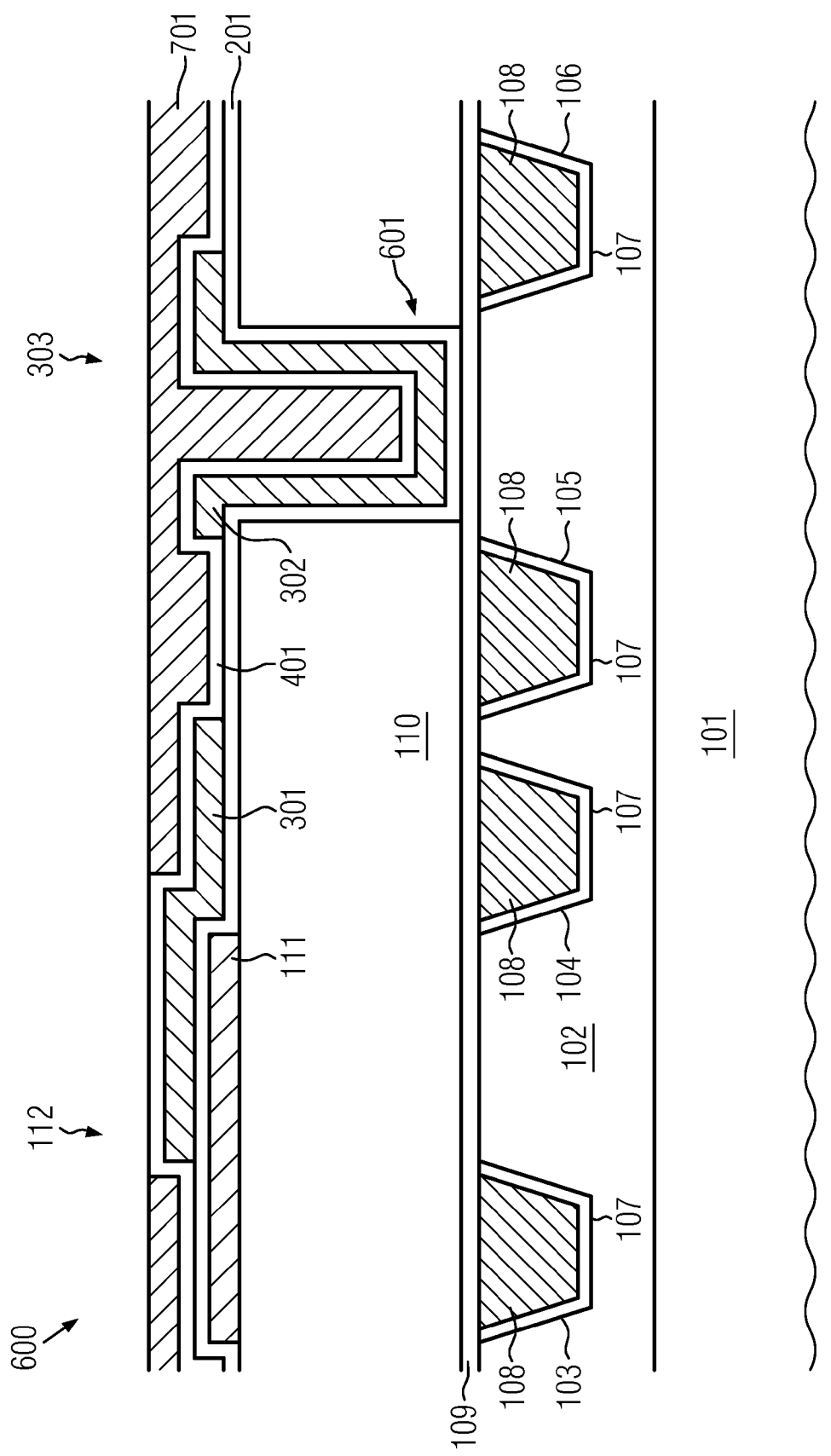

FIG. 8 shows a schematic cross-sectional view of the semiconductor structure 600 in a later stage of the manufacturing process. After the deposition of the electrically conductive material 701, a planarization process, for example, a CMP process, may be performed for obtaining a substantially planar surface of the electrically conductive material 701 and for reducing a thickness of portions of the electrically conductive material 701 outside the trench 601. In some embodiments, the CMP process may be stopped as soon as a portion of the layer 401 of second dielectric material over the top electrode 301 of the first capacitor 112 is exposed.

Figure 9:
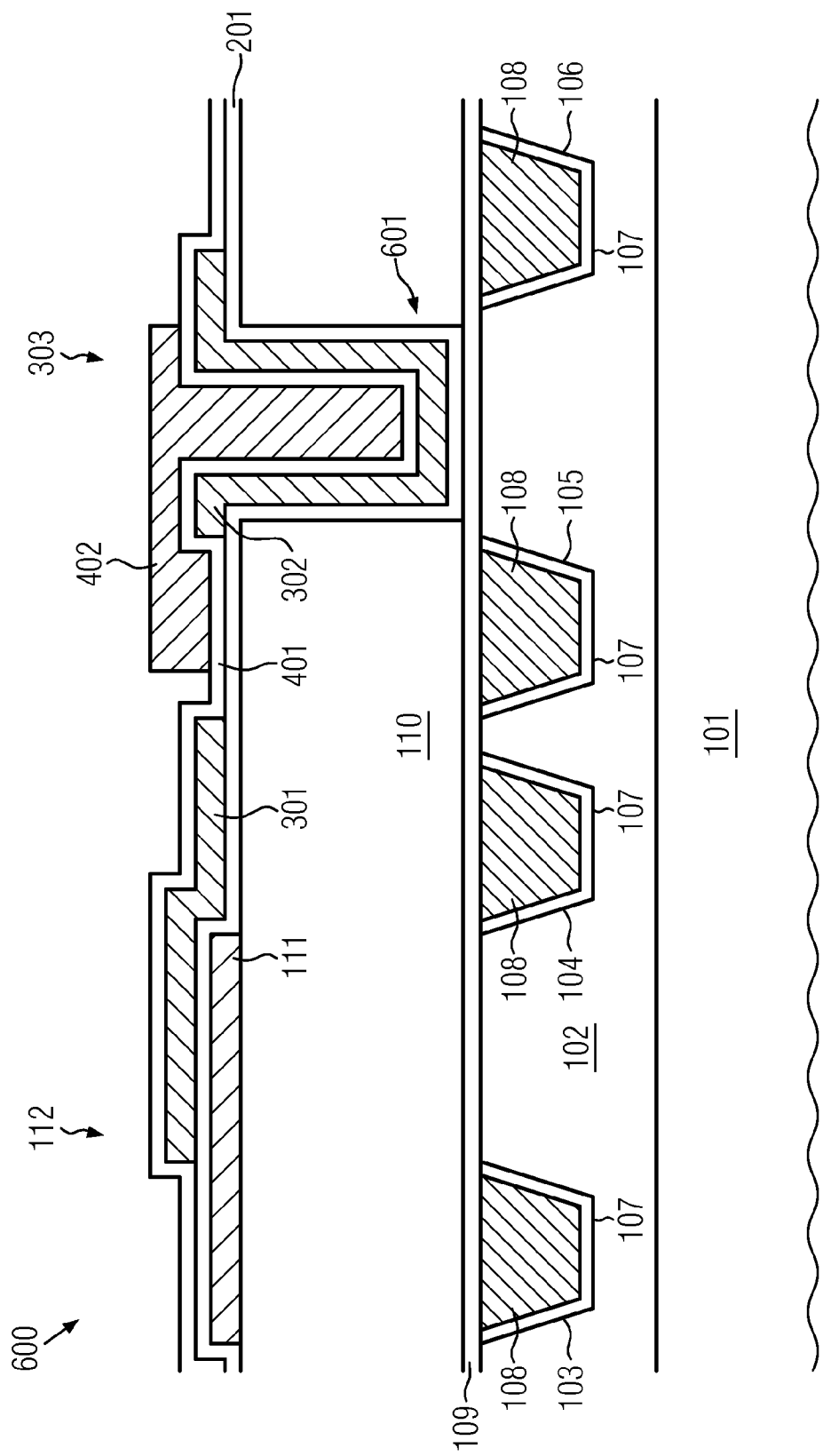

FIG. 9 shows a schematic cross-sectional view of the semiconductor structure 600 in a later stage of the manufacturing process. After the CMP process, the electrically conductive material 701 may be patterned by means of techniques of photolithography and etching for forming a top electrode 402 of the second capacitor 303 from the electrically conductive material 701.

After the formation of the top electrode 402 of the second capacitor 303, a further interlayer dielectric may be deposited over the semiconductor structure 600, and contact vias filled with an electrically conductive material may be formed for providing an electrical connection between the bottom electrode 111 of the first capacitor 112 and the trench 103 filled with the electrically conductive material 108, an electrical connection between the top electrode 301 of the first capacitor 112 and the trench 104 filled with the electrically conductive material 108, an electrical connection between the top electrode 402 of the second capacitor 303 and the trench 105 filled with the electrically conductive material 108, and an electrical connection between the bottom electrode 302 of the second capacitor 303 and the trench 106 filled with the electrically conductive material 108. The formation of the further interlayer dielectric and the contact vias may be performed as described above with reference to FIGS. 4 and 5.

Similar to the embodiments described above with reference to FIGS. 1-5, the first capacitor 112 may be used as a decoupling capacitor in a power supply grid for an integrated circuit provided in the semiconductor structure 600, and the second capacitor 303 may be used as a ferroelectric capacitor in a nonvolatile memory cell of the integrated circuit provided in the semiconductor structure 600. Since portions of the bottom electrode 302 and the top electrode 402 of the second capacitor 303 are provided in the trench 601, compared to the embodiments described above with reference to FIGS. 1-5, in the embodiments of FIGS. 6-9, a capacitance of the second capacitor 303 per area of the semiconductor structure 600 may be improved.

Figure 10:
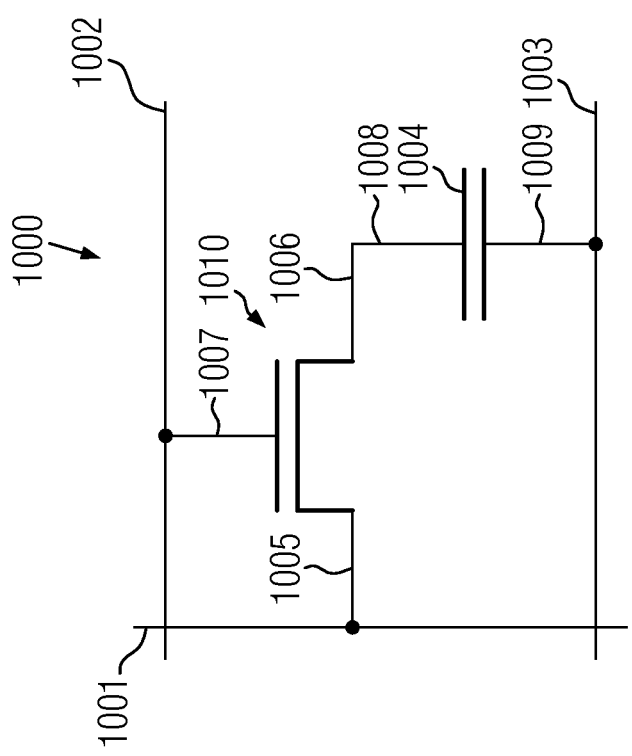
FIG. 10 shows a circuit diagram of a nonvolatile memory cell in a semiconductor structure according to an embodiment.

FIG. 10 shows a schematic circuit diagram of a nonvolatile memory cell 1000 that may be provided in the semiconductor structure 100 described above with reference to FIGS. 1-5 or in the semiconductor structure 600 described above with reference to FIGS. 6-9.

The nonvolatile memory cell 1000 includes a capacitor 1004 having a ferroelectric capacitor dielectric. The capacitor 1004 may be provided by the second capacitor 303 of the semiconductor structure 100 described above with reference to FIGS. 1-5 or the second capacitor 303 of the semiconductor structure 600 described above with reference to FIGS. 6-9.

The nonvolatile memory cell 1000 further includes a field effect transistor 1010. The field effect transistor 1010 may be a field effect transistor of a known type, and it may be formed at a semiconductor material of the substrate 101. The transistor 1010 includes a first source/drain region 1005, a second source/drain region 1006, and a gate electrode 1007. The first source/drain region 1005 is electrically connected to a bitline 1001, and the gate electrode 1007 is electrically connected to a wordline 1002. The second source/drain region 1006 is electrically connected to one of the electrodes of the capacitor 1004 by an electrical connection 1008. The other electrode of the capacitor 1004 is electrically connected to a plate line 1003 by a second electrical connection 1009.

In some embodiments, the electrical connection 1008 may be provided by a contact via and a trench filled with an electrically conductive material connected to the top electrode 402, and the electrical connection 1009 may be provided by a contact via and a trench filled with an electrically conductive material connected to the bottom electrode 302. In other embodiments, the electrical connection 1008 may be provided by a contact via and a trench filled with an electrically conductive material connected to the bottom electrode 302, and the electrical connection 1009 may be provided by a contact via and a trench filled with an electrically conductive material connected to the top electrode 402.

The semiconductor structure 100 or 600, respectively, may include an array of nonvolatile memory cells having a configuration corresponding to that of the nonvolatile memory cell 1000, wherein the first source/drain regions of the transistors of the nonvolatile memory cells in one column of the array of nonvolatile memory cells are electrically connected to the same bitline, and the gate electrodes of the transistors of the nonvolatile memory cells in one row of the array of nonvolatile memory cells are electrically connected to the same wordline.

For accessing the nonvolatile memory cell 1000, a voltage adapted for switching the transistor 1010 into an electrically conductive state may be applied to the wordline 1002, and voltages for reading data or writing data may be applied to the bitline 1001 and the plate line 1003. The reading of data from the nonvolatile memory cell 1000 and the writing of data to the nonvolatile memory cell 1000 may be performed in accordance with known techniques for reading data from a ferroelectric memory cell and for writing data to a ferroelectric memory cell.

Compared to semiconductor structures wherein only a decoupling capacitor having features corresponding to those of the first capacitor 112 in the embodiments described above with reference to FIGS. 1-9 is formed, in the embodiments described above with reference to FIGS. 1-5, one additional photo mask is used for patterning a layer of electrically conductive material from which the top electrode 402 of the second capacitor 303 is formed. The patterning of the layer 202 of electrically conductive material for forming the bottom electrode 302 of the second capacitor 303 may be performed using the same photo mask as for forming the top electrode 301 of the first capacitor 112, since the top electrode 301 of the first capacitor 112, and the bottom electrode 302 of the second capacitor 303 may be formed in a common patterning process. Moreover, the contact vias 503, 504 which are provided for providing electrical connections to the electrodes 302, 402 of the second capacitor 303 may be formed in a same patterning process as the contact vias 501, 502 which are employed for providing electrical connections to the electrodes 111, 301 of the first capacitor 112.

In the embodiments described above with reference to FIGS. 6-9, a further photo mask is used for forming the trench 601, so that two masks are used for forming the second capacitor 303 in addition to the masks used in the formation of the first capacitor 112.

For integrating floating gate-based flash memory into an integrated circuit, typically more than eight additional photo masks are required, in addition to the masks employed for forming other elements of the integrated circuit than the floating gate-based flash memory cells. Therefore, embodiments as described herein may be carried out using a reduced number of additional photo masks, which may help to reduce the costs of the manufacturing process.

Experiments performed by the inventors have shown that a polarization hysteresis may be obtained when a voltage is applied between the electrodes 302, 402 of the second capacitor 303 in a semiconductor structure having features corresponding to those of the semiconductor structure 100 described above with reference to FIGS. 1-5, wherein the second dielectric material 401 included hafnium dioxide. A remnant polarization of at least about 10 $\mu C/cm^2$ and a low amount of leakage current could be obtained. Endurance measurements wherein a rectangular signal of +/−2.5 V was applied at a frequency of 20 kHz have shown that a ferroelectric switching between two polarization states of the capacitor dielectric of the second capacitor 303 may be obtained for at least five million switching cycles, and no drift in coercive voltages was obtained during the endurance testing.

The present disclosure is not limited to embodiments wherein three layers of electrically conductive material are used for forming the electrodes of a decoupling capacitor and a ferroelectric capacitor as in the embodiments described above. In other embodiments, the capacitor dielectric of the decoupling capacitor and the capacitor dielectric of the ferroelectric capacitor may be formed of the same material. In such embodiments, wherein the capacitor dielectric of the decoupling capacitor may also have ferroelectric properties, the electrodes of the decoupling capacitor and the ferroelectric capacitor may be formed in accordance with known techniques for forming metal-insulator-metal capacitors in semiconductor structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a semiconductor structure comprising a first interlayer dielectric provided over a semiconductor substrate;
   forming a first electrode of a first capacitor over said first interlayer dielectric;
   depositing a layer of first dielectric material over said first electrode of said first capacitor and said first interlayer dielectric;
   depositing a layer of electrically conductive material over said layer of first dielectric material;
   forming a second electrode of said first capacitor and a first electrode of a second capacitor from said layer of electrically conductive material; and
   after the formation of said second electrode of said first capacitor and said first electrode of said second capacitor, depositing a layer of second dielectric material and forming a second electrode of said second capacitor over said layer of second dielectric material.

2. The method of claim 1, wherein said first dielectric material and said second dielectric material differ with respect to their ferroelectric properties.

3. The method of claim 2, wherein said first dielectric material is substantially non-ferroelectric and said second dielectric material is ferroelectric.

4. The method of claim 3, wherein said second dielectric material comprises at least one of hafnium dioxide, zirconium dioxide and hafnium zirconium dioxide.

5. The method of claim 4, further comprising:
   after the formation of said second electrode of said second capacitor, depositing a second interlayer dielectric;
   planarizing said second interlayer dielectric;
   forming a plurality of contact vias in said first interlayer dielectric and said second interlayer dielectric; and
   filling said plurality of contact vias with an electrically conductive material, said plurality of contact vias filled with said electrically conductive material providing respective electrical connections to each of said first electrode of said first capacitor, said second electrode of said first capacitor, said first electrode of said second capacitor and said second electrode of said second capacitor.

6. The method of claim 5, wherein said semiconductor structure further comprises a transistor, one of said contact vias providing electrical connections to said first electrode of said second capacitor and said second electrode of said second capacitor being electrically connected to said transistor, said transistor and said second capacitor forming a nonvolatile memory cell.

7. The method of claim 6, wherein at least one of said first electrode of said first capacitor, said layer of electrically conductive material and said second electrode of said second capacitor comprises at least one of titanium nitride, tantalum nitride, tantalum and ruthenium.

8. The method of claim 7, wherein said layer of first dielectric material comprises a material having a greater dielectric constant than silicon dioxide.

9. The method of claim 7, wherein the deposition of said layer of first dielectric material comprises depositing a first sub-layer of said first electrode of said first capacitor and said first interlayer dielectric, depositing a second sub-layer on said first sub-layer and depositing a third sub-layer on said second sub-layer, wherein each of said first sub-layer and said third sub-layer comprises at least one of hafnium dioxide and zirconium dioxide and said second sub-layer comprises aluminum oxide.

10. The method of claim 1, further comprising forming a trench in said first interlayer dielectric, wherein at least portions of said layer of electrically conductive material, said second dielectric material and said second electrode of said second capacitor are provided in said trench.

11. The method of claim 10, wherein the formation of said second electrode of said second capacitor comprises:
    depositing a layer of a material of said second electrode on said second capacitor; and
    performing a polishing process, said polishing process removing portions of said layer of said material of said second electrode of said second capacitor outside said trench.

12. A method, comprising:
    providing a semiconductor structure comprising a first interlayer dielectric provided over a semiconductor substrate;
    forming a first electrode of a first capacitor over said first interlayer dielectric;
    depositing a layer of substantially non-ferroelectric dielectric material over said first electrode of said first capacitor and said first interlayer dielectric;
    depositing a layer of electrically conductive material over said layer of substantially non-ferroelectric dielectric material;
    forming a second electrode of said first capacitor and a first electrode of a second capacitor from said layer of electrically conductive material;
    depositing a layer of ferroelectric dielectric material above said first and second electrodes; and
    forming a second electrode of said second capacitor over said layer of ferroelectric dielectric material.

13. The method of claim 12, wherein said layer of ferroelectric dielectric material comprises at least one of hafnium dioxide, zirconium dioxide and hafnium zirconium dioxide.

14. The method of claim 12, further comprising:
    depositing a second interlayer dielectric above said first and second capacitors;
    planarizing said second interlayer dielectric;
    forming a plurality of contact vias in said first interlayer dielectric and said second interlayer dielectric; and
    filling said plurality of contact vias with an electrically conductive material, said plurality of contact vias filled with said electrically conductive material providing respective electrical connections to each of said first electrode of said first capacitor, said second electrode of said first capacitor, said first electrode of said second capacitor and said second electrode of said second capacitor.

15. The method of claim 14, wherein said semiconductor structure further comprises a transistor, one of said contact vias providing electrical connections to said first electrode of said second capacitor and said second electrode of said second capacitor being electrically connected to said transistor, said transistor and said second capacitor forming a nonvolatile memory cell.

16. The method of claim 15, wherein at least one of said first electrode of said first capacitor, said layer of electrically conductive material and said second electrode of said second capacitor comprises at least one of titanium nitride, tantalum nitride, tantalum and ruthenium.

17. The method of claim 12, wherein said layer of substantially non-ferroelectric dielectric material comprises a material having a greater dielectric constant than silicon dioxide.

18. The method of claim 15, wherein depositing said layer of substantially non-ferroelectric dielectric material comprises depositing a first sub-layer on said first electrode of said first capacitor and said layer of substantially non-ferroelectric dielectric material, depositing a second sub-layer on said first sub-layer and depositing a third sub-layer on said second sub-layer, wherein each of said first sub-layer and said third sub-layer comprises at least one of hafnium dioxide and zirconium dioxide and said second sub-layer comprises aluminum oxide.

19. The method of claim 12, further comprising forming a trench in said first interlayer dielectric, wherein at least portions of said layer of electrically conductive material, said layer of ferroelectric dielectric material and said second electrode of said second capacitor are provided in said trench.

20. The method of claim 19, wherein forming said second electrode of said second capacitor comprises:
   depositing a layer of a material of said second electrode on said second capacitor; and
   performing a polishing process, said polishing process removing portions of said layer of said material of said second electrode of said second capacitor outside said trench.

* * * * *